United States Patent
Rajski et al.

(10) Patent No.: US 6,954,888 B2
(45) Date of Patent: *Oct. 11, 2005

(54) ARITHMETIC BUILT-IN SELF-TEST OF MULTIPLE SCAN-BASED INTEGRATED CIRCUITS

(76) Inventors: Janusz Rajski, 32095 6502 Horton Rd., West Linn, OR (US) 97068-2847; Jerzy Tyszer, Os. Rusa 12/123, 61-245 Poznan (PL)

(*) Notice: Subject to any disclaimer, the term of this patent is extended or adjusted under 35 U.S.C. 154(b) by 13 days.

This patent is subject to a terminal disclaimer.

(21) Appl. No.: 10/777,443

(22) Filed: Feb. 10, 2004

(65) Prior Publication Data

US 2005/0060626 A1 Mar. 17, 2005

Related U.S. Application Data

(63) Continuation of application No. 09/276,474, filed on Mar. 25, 1999, which is a continuation of application No. 08/814,042, filed on Mar. 10, 1997, now Pat. No. 5,991,898.

(51) Int. Cl.$^7$ .......................... H02H 3/05; G01R 31/28; G06F 11/30
(52) U.S. Cl. .......................... 714/739; 714/30; 714/46; 714/715; 714/727; 714/728; 713/200
(58) Field of Search .......................... 713/200; 714/30, 714/25, 46, 728, 729, 727, 715, 739, 33, 28, 29, 27

(56) References Cited

U.S. PATENT DOCUMENTS

| | | | |
|---|---|---|---|
| 4,511,967 A | | 4/1985 | Witalka et al. |
| 4,947,395 A | | 8/1990 | Bullinger et al. |
| 5,224,101 A | * | 6/1993 | Popyack, Jr. ............... 714/718 |
| 5,226,149 A | | 7/1993 | Yoshida et al. |
| 5,239,262 A | | 8/1993 | Grutzner et al. |
| 5,369,646 A | | 11/1994 | Shikatani |
| 5,383,143 A | * | 1/1995 | Crouch et al. ............... 708/254 |
| 5,416,783 A | * | 5/1995 | Broseghini et al. ......... 714/728 |
| 5,515,530 A | * | 5/1996 | Eskandari ....................... 714/1 |
| 5,590,354 A | | 12/1996 | Klapproth et al. |
| 5,617,531 A | * | 4/1997 | Crouch et al. ................ 714/30 |
| 5,661,732 A | * | 8/1997 | Lo et al. ..................... 714/725 |

(Continued)

OTHER PUBLICATIONS

Edirisooriya, et al., "Minimizing Testing Time in Scan Path Architecture," IEEE Circuits and Systems, 1992 Midwest Symposium, pp. 1205–1207.

(Continued)

*Primary Examiner*—Norman M. Wright
(74) *Attorney, Agent, or Firm*—Klarquist Sparkman LLP

(57) ABSTRACT

An apparatus and method provide for an arithmetic built-in self test (ABIST) of a number of peripheral devices having parallel scan registers coupled to a processor core, all within an integrated circuit. Using the data paths of the processor core, operating logic generates pseudo-random test patterns for the peripheral devices, employing a mixed congruential generation scheme. In one embodiment, generating the pseudo-random test patterns includes multiplying n least significant bits of a 2n-bit pseudo-random number generated in an immediately preceding iteration and stored in a first register, with an n-bit multiplier constant stored in a second register to produce a 2n-bit product, adding the 2n-bit product to n most significant bits of the 2n-bit pseudo-random number stored in n least significant locations of an accumulator with 2n locations to produce a new 2n-bit pseudo-random number for a current iteration, and outputting n least significant bits of the new 2n-bit pseudo-random number as an n-bit pseudo-random test vector for the peripheral devices.

21 Claims, 8 Drawing Sheets

U.S. PATENT DOCUMENTS

| | | | | |
|---|---|---|---|---|
| 5,668,817 A | * | 9/1997 | Adham | 714/732 |
| 5,724,603 A | | 3/1998 | Nishiguchi | |
| 5,742,616 A | * | 4/1998 | Torreiter et al. | 714/732 |
| 5,790,561 A | | 8/1998 | Borden et al. | |
| 5,831,992 A | * | 11/1998 | Wu | 714/732 |
| 5,946,247 A | * | 8/1999 | Osawa et al. | 365/201 |
| 5,961,653 A | * | 10/1999 | Kalter et al. | 714/7 |
| 5,991,898 A | * | 11/1999 | Rajski et al. | 714/30 |
| 6,061,818 A | * | 5/2000 | Touba et al. | 714/739 |
| 6,553,526 B1 | * | 4/2003 | Shephard, III | 714/733 |
| 6,728,901 B1 | * | 4/2004 | Rajski et al. | 714/30 |

OTHER PUBLICATIONS

Zacharia, et al., "Decompression of Test Data Using Variable–Length Seed LFSRs," Microelectronics and Computer Systems Laboratory, McGill University, Montreal, Canada.

Adham, et al., "Arithmetic Built–in Self Test for Digital Signal Processing Architectures," in Proceedings of the IEEE 1995 Custom Integrated Circuits Conference, May 1–4, pp. 29.6.0–29.6.4.

Rajski, et al., "On Linear Dependencies in Subspaces of LFSR–Generated Sequences," IEEE, Draft Aug. 6, 1996, pp. 0–11.

Hurd, "Efficient Generation of Statistically Good Pseudonoise by Linearly Interconnected Shift Registers," IEEE Transactions on Computers, vol. C–23, No. 2, Feb. 1974, pp. 146–152.

Hellebrand, et al., "Pattern Generation for a Deterministic BIST Scheme," 1995 IEEE, pp. 88–94.

Rajski, et al., "Test Responses Compaction in Accumlators with Rotate Carry Adders," IEEE Transaction on CAD of Integrated Circuits and Systems, vol. 12, No. 4, Apr. 1993, pp. 531–539.

Rajski, et al., "Accumulator–Based Compaction of Test Responses," IEEE Transactions on Computers, vol. 42, No. 6, Jun. 1993, pp. 643–650.

Hellebrand, et al., "Built–in Test for Circuits with Scan Based on Reseeding of Multiple–Polynomial Linear Feedback Shift Registers," IEEE Transactions on Computers, vol. 44, No. 2, Feb. 1995, pp. 223–233.

* cited by examiner

ARITHMETIC BUILT-IN SELF-TEST OF MULTIPLE SCAN-BASED INTEGRATED CIRCUITS

CROSS-REFERENCE TO PRIOR APPLICATIONS

This application is a continuation of U.S. patent application Ser. No. 09/276,474, filed Mar. 25, 1999, which is a continuation of U.S. patent application Ser. No. 08/814,042, filed on Mar. 10, 1997, now U.S. Pat. No. 5,991,898, issued Nov. 23, 1999, both of which are hereby incorporated by reference.

BACKGROUND OF THE INVENTION

1. Field of the Invention

The present invention relates generally to testing of integrated circuits (IC) and more particularly to arithmetic built-in self-test (ABIST) of multiple scan-based ICs.

2. Background Information

Many ICs are produced in large volume and very often operate at high speeds. Since their manufacturing yield strongly depends on the silicon area, and their performance is directly related to the delays on critical paths, it is essential that the testing strategy provides a high fault coverage without a significant area overhead and performance degradation. As the costs associated with detecting faults rise over thousands of times from the time ICs are fabricated to the time the final product is released to customers, the most effective way to prevent costly rework is to consider testing issues as early in the design cycle as possible. Practical importance of this problem in conjunction with the increasing complexity of VLSI circuits not balanced by a corresponding increase in the number of input and output pins, has made built-in self-test (BIST) one of the most important technology in IC testing that is expected to profoundly influence the area requirement of ICs in upcoming years.

In BIST, the original circuit designed to perform the system functions is appended with additional circuitry for generation of test patterns[1] and compaction of test responses. Thus, the BIST approach can be applied at all levels of testing, starting from wafer and device to system and field testing. Appending these circuitry to the original circuit satisfies the high fault coverage requirement while reducing the dependence on expensive external testing equipment. However, this solution compromises an IC's area and performance as it inevitably introduces either a hardware overhead or additional delays and increased latency. These delays may be excessive for high-speed ICs used in several applications such as high-performance microprocessors, digital signal processing (DSP) systems, new generations of floating point processors, and others. Therefore, BIST schemes are often evaluated on the basis of the fault coverage they provide, area overhead they require, and the performance penalty they produce. Other criteria include test application time, scalability, and test-pattern portability. For further description of BIST, see, for example, V. D. Agrawal, C. R. Kime, and K. K. Saluja, "A Tutorial on Built-In Self Test. Part 1: Principles", *IEEE Design and Test of Computers*, March 1993, pp. 73–82, and V. D. Agrawal, C. R. Kime, and K. K. Saluja, "A Tutorial on Built-In Self-Test. Part 2: Applications", *IEEE Design and Test of Computers*, June 1993, pp. 69–73.

[1] For the purpose of this patent application, a test pattern is a set of one or more test vectors (also referred to as test cubes).

High fault coverage in BIST can be achieved only if all faults of interest are detected, and their effects are retained in the final compacted signature. A number of test pattern generation and test response compaction techniques have been proposed in the open literature and are used in the industrial practice. The majority of these techniques employ Linear Feedback Shift Registers (LFSRs), Multiple Input Signature Registers (MISRs), or Cellular Automata (CAs), as implementation platforms to cope with various types of failures and errors, and to support variety of test scenarios.

An efficient test pattern generator which guarantees complete fault coverage while minimizing test application time, area overhead, and test data storage is clearly essential for a successful BIST scheme. The generation schemes proposed in the art so far offer trade-offs between these parameters. The solutions range from pseudo-random techniques that do not use any storage (for test data) but take a long application time and often do not detect some faults to deterministic techniques that may require significant storage but achieve complete fault coverage in a relatively short time. Since most of the traditional design for testability (DFT) techniques use internal and external scan paths, several test pattern generators for incorporating into these designs have been also employed. They differ in the requirements placed on the nature of produced test vectors and on the scan-path features they utilize. A common drawback of the scan-path techniques is a long test application time due to the need to scan data in and out of the circuit. This usually alleviated by breaking the scan chain (also referred to as the scan register) into many shorter paths which are loaded in parallel from the generator, and scanned out in parallel to a signature generator. Consequently, a number of techniques have been proposed in the art for two-dimensional test-sequence generation. They are mostly based on LFSRs as shown for example by W. J. Hurd in the paper entitled "Efficient Generation of Statistically Good Pseudonoise by Linearly Interconnected Shift Resisters", *IEEE Trans. Computers*, vol. C-23, 1974, pp. 146–152, and, due to structural and linear dependencies, may not be able to produce some test patterns.

In general, schemes based on pseudo-random patterns may fail to detect some faults in some circuits due to inherent limitations of pseudo-random test vectors. In such a case, deterministic patterns are used to target the remaining hard-to-test faults. Using these deterministic patterns in conjunction with the pseudo-random patterns allows obtaining different trade-offs between test data storage and test application time by varying the relative number of deterministic and pseudo-random patterns. However, the overall efficiency of BIST scheme resting on such mixed-mode generation techniques strongly depends on the methods employed to reduce the amount of test data.

The quantity of test data can be reduced by compressing deterministic test patterns. This approach rests on the fact that the deterministic test patterns frequently feature a large number of unspecified positions. A compression method based on the reseeding of LFSRs has been originally proposed by B. Koenemann in the paper entitled "LFSR-Coded Test Patterns for Scan Designs", in *Proc European Test Conf.*, Munich 1991, pp. 237–242. A comprehensive analysis of this scheme as well as a new reseeding scenario based an Multiple Polynomial Linear Feedback Shift Registers (MP-LFSRs) has been provided by S. Hellebrand, J. Rajski, S. Tarnick, S. Venkataraman and B. Courtois in the paper entitled "Built-In Test for Circuits with Scan Based on Reseeding of Multiple-Polynomial Linear Feedback Shift Registers", *IEEE Trans. on Computers*, vol. C-44, February 1995, pp. 223–33. A similar technique has been also discussed by S. Hellebrand, B. Reeb, S. Tarnick, and H.-J. Wunderlich in the paper entitled "Pattern Generation for a Deterministic BIST Scheme", in *Proc. ICCAD*, November 1995, pp. 88–94. Using this method, a concatenated group of test cubes with a total of s specified bits is encoded with approximately s bits specifying a seed and a polynomial identifier. The content of the MP-LFSR is loaded for each group, and has to be preserved during the decompression of each test cube within the group. An alternative to concatenation was proposed by N. Zacharia, J. Rajski, and J. Tyszer in the paper entitled "Decompression of Test Data using Variable-Length Seed LFSRs", *Proc. VLSI Test Symposium*, Princeton 1995, pp.426–33. The underlying idea rests on the concept of variable-length seeds. Deterministic patterns are generated by an LFSR loaded with the seeds whose lengths may be smaller than the size of the LFSR. Allowing such "shorter" seeds yields higher encoding efficiency even for test cubes with varying number of specified positions.

Efficiency of the test response compaction techniques, in common with the test generation schemes, is another essential factor for a successful BIST scheme. Many schemes have been proposed to compact test responses in the conventional BIST environments. The best-known compaction techniques are based on LFSRs, CAs, counters and check sums. Extensive theoretical studies have been conducted to analyze both the asymptotic and transient behavior of the aliasing probability (i.e., the average probability of no faults being detected due to compaction after a sufficiently long test experiment) introduced by these schemes. The most commonly used compactors for compaction of parallel responses in the multiple scan environments are based on the MISRs. They introduce the aliasing probability of $2^{-n}$, where n is the size of the register, and their transient behaviors depend on the characteristic polynomials. A systematic review of the compaction schemes and related theoretical results is provided by S. Pilarski and T. Kameda in *A Probabilistic analysis of test-response compaction*, IEEE Computer Society Press, 1995.

Circuits based on data-path architectures constitute an increasingly large portion of integrated chips manufactured by the microelectronics industry. The proliferation of embedded cores and high-performance computing systems, such as DSP circuits, micro-controllers, and micro-processors clearly demonstrates inadequacy of existing BIST schemes if they are to entail non-intrusive, at-speed and portable testing. Recently, a new BIST paradigm was proposed by S. Adham, M. Kassab, N. Mukherjee, K. Radecka, J. Rajski, and J. Tyszer in the paper entitled "Arithmetic built-in self-test for digital signal processing architectures", *Proc. CICC*, pp. 659–662, 1995, which makes it possible to use the functionality of these circuits (also referred to as mission logic or mission data paths) to perform built-in self-test for a DSP core rather than adding test hardware which can introduce area overhead and performance degradation. The resulting test sessions are controlled by microcode and use the mission data path building blocks, such as adders, multipliers, and ALUs, to generate test patterns for a DSP core, and compact its test responses. In such an environment, the need for extra hardware is either entirely eliminated or drastically reduced, test vectors are easily distributed to different parts of the DSP core, test responses are easily collected, and there is virtually no performance degradation. Furthermore, the approach can be used for at-speed testing, thereby providing a capability to detect failures that may not be detected by conventional low-speed testing. However, the ABIST proposal presented in the Adham article did not address generation of test patterns for peripheral devices, in particular, peripheral devices with "shortened" multiple scan-chains in ICs.

Thus, it is desirable to be able to extend the ABIST methodology to provide efficient BIST methods for multiple scan-based ICs, and tailoring the ABIST to conventional DFT environmental.

SUMMARY OF THE INVENTION

In accordance with one aspect of the present invention, an IC with an embedded processor core, peripheral devices, and associated multiple scan chains, is provided with microcode that implements an arithmetic pseudo-random number generator, which when executed by the embedded processor core, generates two-dimensional (2-D) pseudo-random test vector sequences for testing the peripheral devices. The arithmetic pseudo-random number generator employs an improved mixed congruential generation scheme.

In accordance with another aspect of the present invention, the IC is further provided with microcode that implements an arithmetic parallel decompressor, which when executed by the embedded processor core, generates 2-D deterministic test vectors for testing the peripheral devices. The arithmetic parallel decompressor generates multiple segments of each deterministic test vector in parallel, emulating a number of LFSR-based segments interconnected by a network of linear functions.

In accordance with yet another aspect of the present invention, the IC is further provided with microcode that implements an arithmetic test response compactor, which when executed by the embedded processor core, compacts test responses of the peripheral devices into a signature. The arithmetic test response compactor compacts the test responses in a cascaded add-and-accumulate manner, reducing the impact of an error compensation phenomenon.

In accordance with yet another aspect of the present invention, the IC is further provided with a test port register for interfacing between the embedded processor core and the multiple scan chains associated with the peripheral devices, providing the multiple scan chains with the pseudo-random and deterministic test vectors generated by the embedded processor core, and returning the test responses of the peripheral devices to the embedded processor core (through the multiple scan chains).

In accordance with yet another aspect of the present invention, the IC is further provided with microcode that implements a number of instructions for moving the generated pseudo-random and deterministic test vectors to the test port register, and then to the scan chains, applying the test vectors to the circuits under test (i.e. the peripheral devices), and moving the test responses from the test port register and then to the embedded processor core. In one embodiment, the test responses are moved from the scan chains to the test port register, as an integral part of moving test vectors into the scan chains.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified for clarity.

Parts of the description will be presented in terms of operations performed inside an integrated circuit with an embedded processor core and peripheral devices, using terms such as data, bits, values, numbers and the like, consistent with the manner commonly employed by those skilled in the art to convey the substance of their work to others skilled in the art. As well understood by those skilled in the art, these quantities take the form of electrical signals capable of being stored, transferred, combined, and otherwise manipulated through electrical elements of the IC; and the term embedded processor core include microcontroller, microprocessor, digital signal processor (DSP) cores, and the like.

Various operations will be described as multiple discrete steps performed in turn in a manner that is most helpful in understanding the present invention. However, the order of description should not be construed as to imply that these operations are necessarily order dependent.

Figure 1:
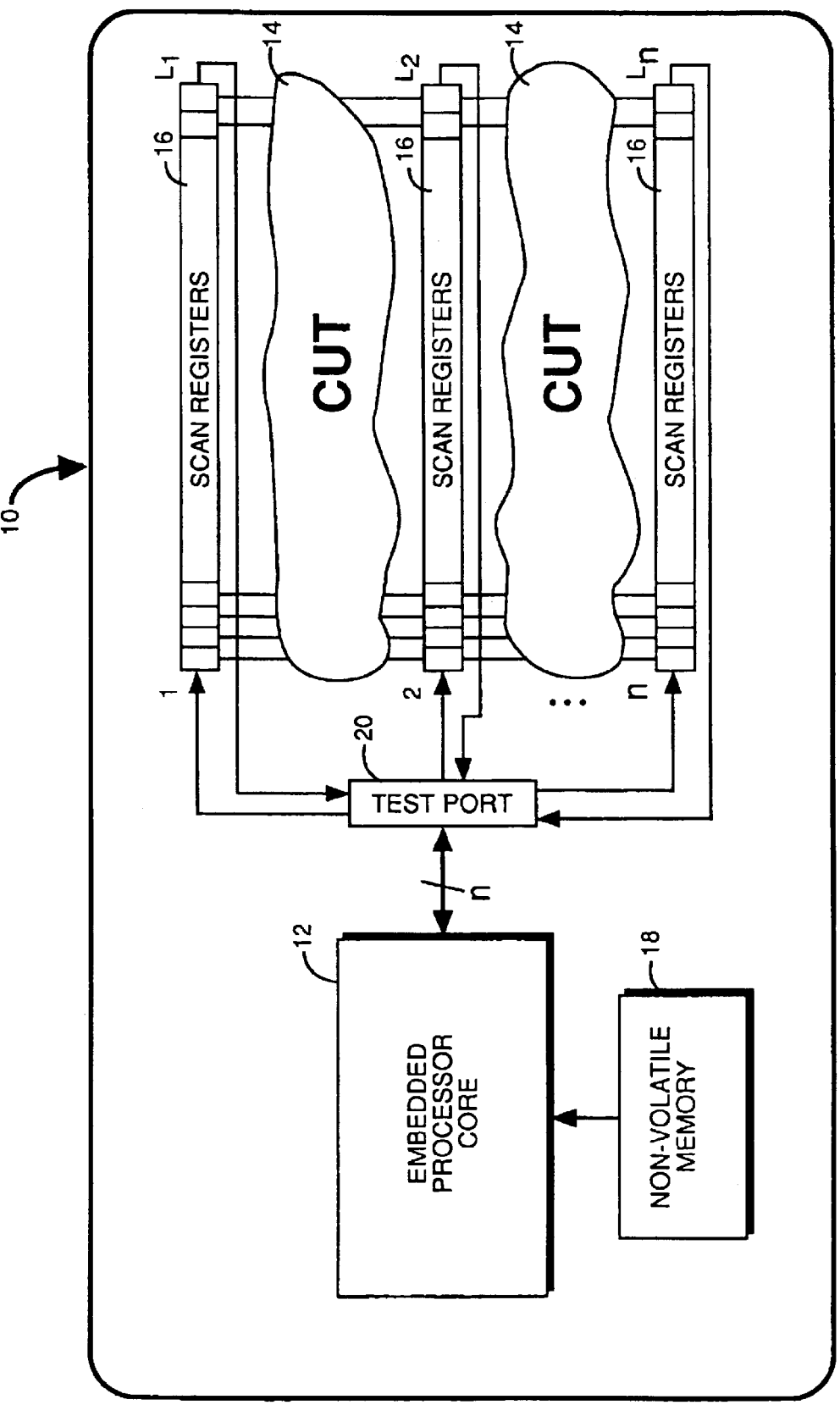
FIG. 1 illustrates an exemplary IC incorporated with the teachings of the present invention.

Referring now to FIG. 1, wherein an exemplary IC incorporated with the teachings of the present invention is shown. Exemplary IC 10 includes embedded processor core 12, peripheral devices 14 having multiple associated scan registers 16, non-volatile memory 18, and test port register 20, coupled to each other as shown. Peripheral devices 14 are also designated as circuit under test (CUT), whereas scan registers 16 are also referred to as scan chains. Except for test port register 20, ABIST instructions provided to processor core 12, and the manner embedded processor core 12, scan registers 16, and non-volatile memory 18 are used to practice various aspects of the present invention, embedded processor core 12, peripheral devices 14, scan registers 16, and non-volatile memory 18 perform their conventional functions known in the art. They are intended to represent a broad category of these elements known in the art. In other words, except for test port register 20, ABIST instructions provided to processor core 12, and the manner the various other elements are used to practice the present invention, exemplary IC 10 is intended to represent a broad category of ICs known in the art.

As will be described in more detail below, non-volatile memory 18 includes various microcode that implement an arithmetic pseudo-random number generator, an arithmetic parallel decompressor and a test response compactor of the present invention. When executed by embedded processor core 12, the arithmetic pseudo-random number generator generates 2-D pseudo-random test vector sequences, whereas the arithmetic parallel decompressor generates 2-D deterministic test vectors for testing peripheral devices 14. When executed by embedded processor core 12, the arithmetic test response compactor compacts test responses of peripheral devices 14 into a signature.

Test port register 20 serves as an interface between embedded processor core 12 and scan registers 16. For ease of explanation, the data path between embedded processor core 12 and test port register 20 for the illustrated embodiment is n-bit wide, and there are n scan registers 16, each having the same length L (i.e. $L_1, L_2, \ldots, L_{n-1}$ all equal L). However, based on the descriptions to follow, those skilled in the art will appreciate that the present invention may by practiced with data path of any size, any number of scan registers of any identical or different lengths. For the illustrated embodiment, test port register 20 includes a number of output ports correspondingly coupled to the first cell of each of scan registers 16, and a number of input ports correspondingly coupled to the last cell of each of scan registers 16. Test port register 20 may be constituted in any one of a number of manners known in the art.

Embedded processor core 12 includes data paths formed with adders, multipliers, ALUs, shifters, registers, etc. Embedded processor core 12 further includes microcode (e.g. in a control store) that implements the ABIST instructions, including instructions for moving the generated pseudo-random/deterministic test vectors to test port register 20 and then to scan registers 16, applying the test vectors to peripheral devices 14, and moving test responses of the peripheral devices 14 from test port register 20 to embedded processor core 12. For the illustrated embodiment, test vectors are shifted into scan registers 16 from test port register 20 by one of the ABIST instructions, and test responses are recovered into test port register 20 from scan registers 16 at the same time, as an integral part of the shifting operation.

In other words, in accordance with the present invention, exemplary IC 10 is provided with ABIST through microcode that leverage on the mission logic of embedded processor core 12, requiring only one extra register in terms of hardware, i.e. test port register 20. Thus, there are virtually no area requirement, nor performance impact on exemplary IC 10. Before further describing how ABIST is provided to exemplary IC 10, it should be noted that why the present invention is being described with the exemplary IC 10 having non-volatile memory 18 storing the various microcode implementing the arithmetic pseudo-random test vector generator, arithmetic parallel decompressor, and arithmetic test response compactors, and so forth, the present invention may be practiced with some or all of the microcode stored in non-volatile or volatile storage medium disposed inside or outside the IC.

Figure 2:
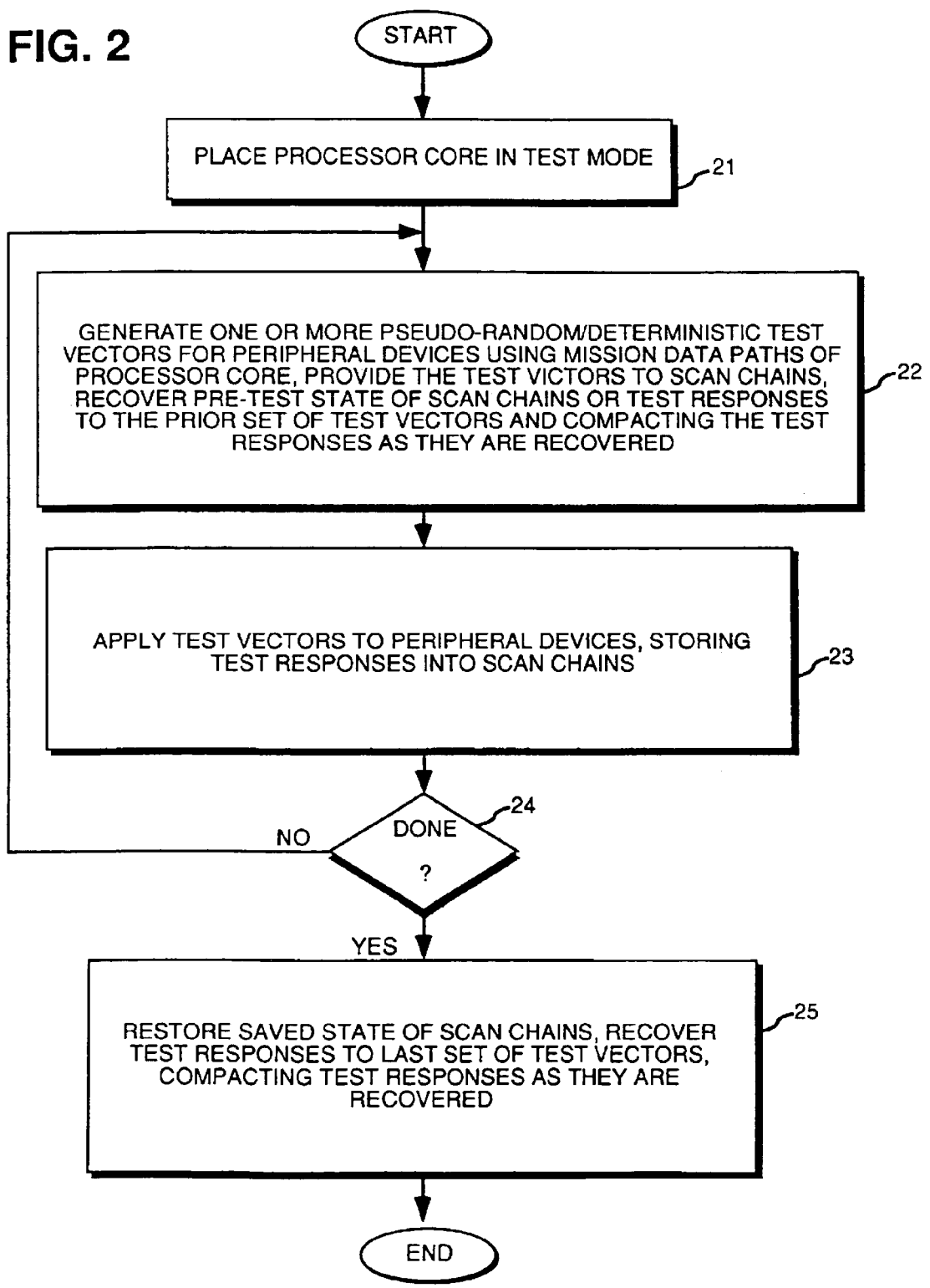
FIG. 2 illustrates one embodiment of the method steps for performing ABIST for the exemplary IC in accordance with the present invention.

FIG. 2 illustrates one embodiment of the method steps for performing ABIST for exemplary IC 10 in accordance with the present invention. As shown, for the illustrated embodiment, in step 21, embedded processor core 12 is first placed into a test mode. In step 22, one or more 2-D pseudo-random or deterministic test vectors are generated using mission data paths of embedded processor core 12 to execute the arithmetic pseudo-random number generator or the arithmetic parallel decompressor of the present invention. The generated 2-D pseudo-random/deterministic test vectors are provided to peripheral devices 14, by way of test port register 20 and scan registers 16, one bit-slice for each scan register at a time for L times. At the same time, test responses to a prior set of test vectors are recovered into embedded processor core 12 from scan registers 16 by way of test port register 20, one bit-slice from each scan register at a time for L times, except of course for the initial provision of test vectors, where the pre-test state of scan registers 16 is recovered instead. The partial test responses are compacted into a signature as they are recovered, using also mission data paths of embedded processor core 12 to execute the arithmetic test response compactor, except of course for the initial application of the first set of test vectors, where the recovered pre-test state of scan registers 16 is saved instead. As in the prior art, pseudo-random test vectors are used to detect most of the faults, whereas deterministic test vectors are used to detect the minority of faults that are known to be difficult to detect.

In step 23, the generated 2-D pseudo-random/deterministic test pattern (i.e. one or more test vectors/cubes) is applied to the circuits under test (i.e. peripheral devices 14).

Steps 22–23 are repeated until it is determined in step 24 all desired test patterns have been generated and applied to peripheral devices 14. Then, in step 25, the save pre-test state of scan registers 16 is restored, one bit slice for each scan register at a time for L times. At the same time, test responses to the last set of test vectors are recovered, one bit slice from each scan register at a time for L times. The partial test responses to the last set of test vectors are compacted into the signature as they are recovered, as earlier described.

Figure 3:
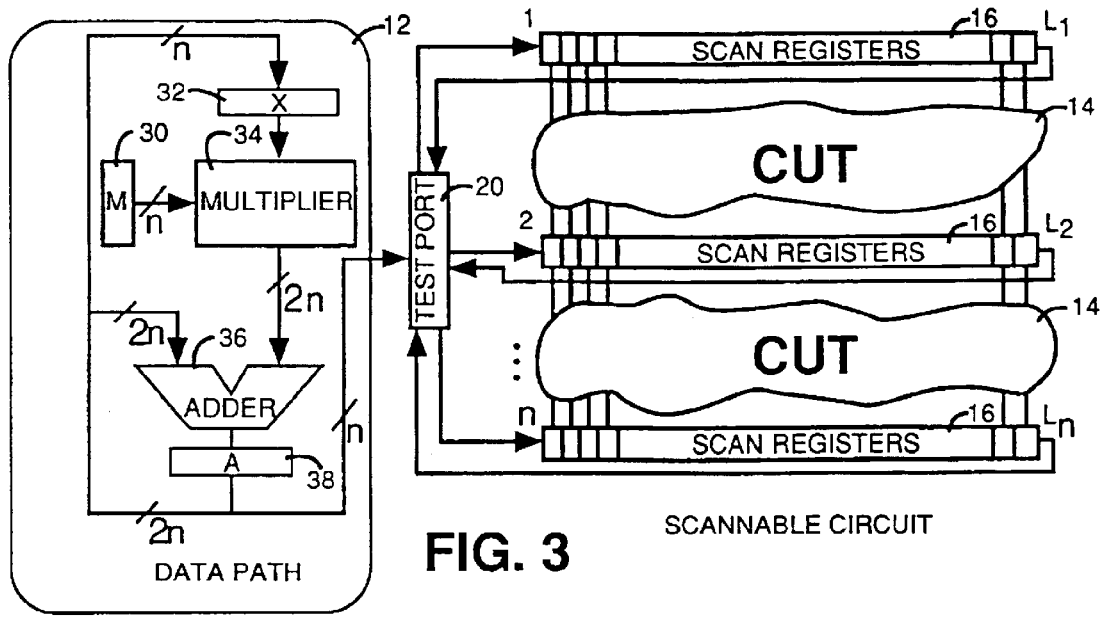
FIGS. 3–4 illustrate one embodiment of the arithmetic pseudo-random generator of the present invention.
Figure 4:
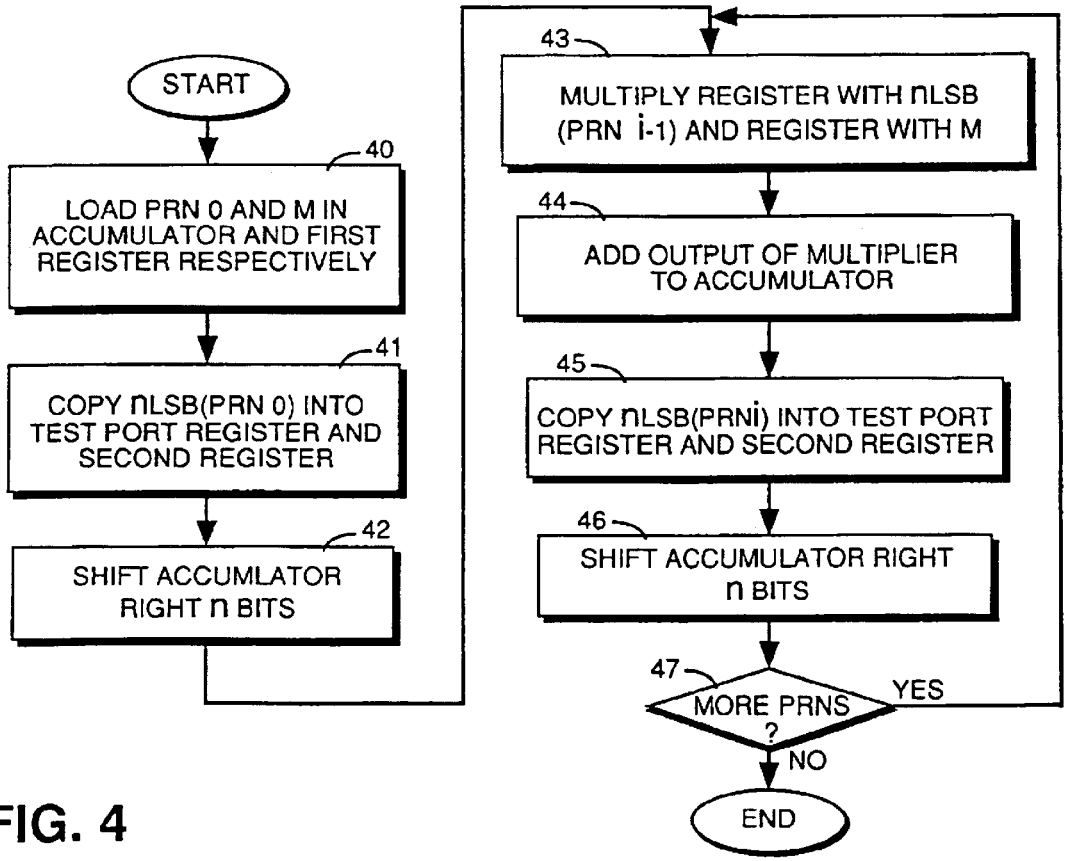

FIGS. 3–4 illustrate one embodiment of the arithmetic pseudo-random number generator of the present invention. The arithmetic pseudo-random number generator generates two-dimensional pseudo-random test vector sequences, using an improved mixed congruential generation scheme. The scheme operates in accordance with the following rule:

$$PRN_i = nLSB(PRN_{i-1}) \times M + nMSB(PRN_{i-1})$$

where $PRN_i$ stands for the pseudo-random number after ith iteration,
nLSB( ) stands for the n least significant bits,
nMSB( ) stands for the n most significant bits, and
M stands for an n-bit constant.

In other words, the pseudo-random number after ith iteration is generated by multiplying the n least significant bit of the pseudo-random number of the previous iteration with the constant M and then adding the result to the n most significant bits of the pseudo-random number of the previous iteration. The scheme is superior to prior art pseudo-random techniques in providing pseudo-random sequences on designated bit positions.

As shown in FIG. 3, for the illustrated embodiment, the scheme is practiced by using registers 30 and 32, multiplier 34, adder 36 and accumulator 38 of embedded processor core 12. Initially, as shown in FIG. 4, in step 40, the initial value ($PRN_0$) and the n-bit constant (M) are loaded into accumulator 38 and register 30 respectively. In step 41, the n least significant bits of the content of accumulator 38 (i.e., $PRN_0$) are copied into test port register 20 (to output the initial test vector) and register 32 (to prepare for the next iteration). In step 42, accumulator 38 is shifted right n-bit (to prepare for the next iteration). In step 43, the content of register 32, i.e., $PRN_{i-1}$, is multiplied by the content of register 30, i.e., M. In step 44, the output of multiplier 34 is added to the content of accumulator 38. In step 45, as in step 41, the n least significant bits of the content of accumulator 38 (i.e., $PRN_i$) are copied into test port register 20 and register 32. In step 46, as in step 42, accumulator 38 is shifted right n-bit again. In other words, after the first PRN, at each clock cycle, a PRN (and therefore a test vector) may be generated. Each n-bit test vector is provided to scan chains 16 in parallel by way of test port register 20, providing 1-bit to each scan chain 16. Thus, after L−1 iterations of steps 43–46 (L being the length of a scan chain 16), scan chains 16 will be filled with a 2-D pseudo-random test pattern.

A primary desirable property of any pseudo-random number sequence that is to be used as source for pseudo-random test vectors is a long period. Experience has shown that various combinations of initial values and multipliers M produce sequences with more desirable periods for various sizes of data paths. These combinations are summarized in Table 1. For instance, for a 3-bit wide data path (n), with an initial value of 1 ($PRN_0$) and a multiplier value of 6 (M), the arithmetic pseudo-random number generator generates the sequence of 1, 6, 36, 28, 27, 21, 32, 4, 24, 3, 18, 14, 37, 34, 16, 2, 12, 25, 9, 7, 42, 17, 8 and 1 (a period of 23). Similarly, for the 3-bit wide data path, with an initial value of 5 ($PRN_0$) and a multiplier value of 6 (M), the arithmetic pseudo-random number generator generates the sequence of 5, 30, 39, 46, 41, 11, 19, 20, 26, 15, 43, 23, 44, 29, 33, 10, 13, 31, 45, 35, 22, 38, 40, and 5 (also a period of 23). For all the combinations shown, almost in all cases, the period is close to $2^{2n-1}$. Thus, any $2^{2n}$ random numbers (and therefore test vectors) may be generated by choosing two initial values in combination with a multiplier M.

TABLE 1

Period Lengths by data path sizes, initial values, and multipliers.

| n  | M     | Initials | Period     |
|----|-------|----------|------------|
| 3  | 6     | 1, 5     | 23         |
| 4  | 15    | 1, 7     | 119        |
| 5  | 27    | 1, 5     | 431        |
| 6  | 45    | 1, 7     | 1439       |
| 7  | 126   | 1, 5     | 8063       |
| 8  | 249   | 1, 5     | 31871      |
| 9  | 507   | 1, 5     | 129791     |
| 10 | 1020  | 1, 7     | 522239     |
| 11 | 2016  | 1, 5     | 2064383    |
| 12 | 4077  | 1, 7     | 8349695    |
| 13 | 8175  | 1, 7     | 33484799   |
| 14 | 16371 | 1, 5     | 134111231  |
| 15 | 32766 | 1, 5     | 536838143  |
| 16 | 65514 | 1, 5     | 2146762751 |

The ability to produce any q-tuple, regardless of location of bits of interest, is the next quality criteria considered. In contrast to LFSR-based generators, the arithmetic pseudo-random test vector generator of the present invention features non-linear dependencies originating from the congruential multiplicative formula used. These dependencies have been examined by Monte Carlo simulations with the objective of determining the probability that randomly selected q positions of the output sequence cannot be covered by some combinations of 0s and 1s, i.e., given a sequence of generated bits, it is verified whether the sequence contains q-bit pattern of 0s and 1s which matches a pre-computed vector of binary values and distances between positions on which these values occur. The Monte Carlo simulations have also been used to analyze corresponding dependencies in LFSR-generated sequence, as the existing closed-form solution of the linear dependency problem cannot be used for sequences shorted than 2.sup.n−1, as was shown by J. Rajski and J.

Tyszer in the paper entitled "On Linear Dependencies in Subspaces of LFSR-Generated Sequences,", IEEE Transactions on Computers, Vol. 45, No. 10, October 1996.

The performance of the arithmetic pseudo-random test vector generator (APRN) of the present invention for n ranging from 4 to 10, and several values of q, is summarized and compared with related 2n-bit LFSRs in Tables 2a and 2b for 100 and 1000-bit sequences, respectively. The values represent the percentage of states that 7 and 8-bit LFSR indicates the fraction of cases in which a given 7-bit binary combination (chosen randomly) appears on randomly selected 7-bit positions in a 100-bit sequence produced by the LFSR. The reported results were obtained for the least significant position of each generator by drawing 1,000,000 samples for each entry to the table. They are also characteristic of other bits and other values of n and q not tabulated below. Clearly, the APRN generator proves to be capable of providing a better state coverage than corresponding LFSRs with primitive polynomials, as in most cases only entries for APRN generators indicate a complete state coverage.

gate level fault simulator. The objective of the simulation experiments was to measure a single stuck-at-fault coverage which can be obtained by using the APRN generator of the present invention. A full scan environment has been assumed. Results are shown in Table 3. Each entry to the table gives the fault coverage for all non-redundant faults in a simulated circuit after applying 32000 test vectors. These test vectors were produced on q least significant bits of generators of different widths n and subsequently fed to q parallel scan chains. In all experiments, the APRN generator was initialized to values 5 or 7, according to Table 1. The results for each circuit are accompanied by the corresponding fault coverage obtained when using pseudo-random patterns. These data are listed in the last column of the Table 3. They have been obtained by repeating the fault simulation experiments ten times for different sequences of pseudo-random test vectors and taking average values. It is evident that the APRN-based test sequences offer the same quality as that obtained from the source of pseudo-random test vectors. Moreover, it is observed that, in many cases, the APRN TABLE 2a Comparison with LFSR based generator 100-bit sequence

| q | APRN n = 4 | LFSR 2n = 8 | APRN n = 5 | LFSR 2n = 10 | APRN n = 6 | LFSR 2n = 12 | APRN n = 7 | LFSR 2n = 14 | APRN n = 8 | LFSR 2n = 16 |
|---|---|---|---|---|---|---|---|---|---|---|
| 3 | 100 | 99.74 | 100 | 99.92 | 100 | 99.99 | 100 | 100 | 100 | 100 |
| 4 | 100 | 98.87 | 100 | 99.68 | 100 | 99.95 | 100 | 100 | 100 | 100 |
| 5 | 99.95 | 96.66 | 100 | 99.07 | 100 | 99.84 | 100 | 99.98 | 100 | 100 |
| 6 | 98.05 | 91.63 | 100 | 97.66 | 100 | 99.59 | 100 | 99.93 | 100 | 99.98 |
| 7 | 85.59 | 81.59 | 99.92 | 94.85 | 100 | 99.01 | 100 | 99.80 | 100 | 99.95 |
| 8 | 61.39 | 63.84 | 97.26 | 89.21 | 99.99 | 97.75 | 100 | 99.50 | 100 | 99.88 |
| 9 | 37.43 | 40.17 | 82.77 | 78.80 | 99.57 | 95.07 | 100 | 98.85 | 100 | 99.71 |
| 10 | 20.63 | 22.43 | 57.79 | 61.64 | 93.93 | 89.65 | 100 | 97.46 | 100 | 99.37 |

TABLE 2b

Comparisons with LFSR based generators 1000-bit sequence

| k | APRN n = 6 | LFSR 2n = 12 | APRN n = 7 | LFSR 2n = 14 | APRN n = 8 | LFSR 2n = 16 | APRN n = 9 | LFSR 2n = 18 | APRN n = 10 | LFSR 2n = 20 |
|---|---|---|---|---|---|---|---|---|---|---|
| 3 | 100 | 99.99 | 100 | 100 | 100 | 100 | 100 | 100 | 100 | 100 |
| 4 | 100 | 99.93 | 100 | 99.98 | 100 | 100 | 100 | 100 | 100 | 100 |
| 5 | 100 | 99.80 | 100 | 99.95 | 100 | 99.99 | 100 | 100 | 100 | 100 |
| 6 | 100 | 99.49 | 100 | 99.87 | 100 | 99.97 | 100 | 99.99 | 100 | 100 |
| 7 | 100 | 98.80 | 100 | 99.69 | 100 | 99.93 | 100 | 99.98 | 100 | 100 |
| 8 | 100 | 97.39 | 100 | 99.33 | 100 | 99.83 | 100 | 99.96 | 100 | 99.99 |
| 9 | 99.69 | 94.46 | 100 | 98.58 | 100 | 99.65 | 100 | 99.91 | 100 | 99.98 |
| 10 | 94.24 | 88.85 | 100 | 97.08 | 100 | 99.29 | 100 | 99.82 | 100 | 99.96 |

The last group of experiments have been conducted for the ISCAS'85 and ISCAS'89 benchmark circuits using a generator allows it to reach the reported fault coverage faster when compared to the other pseudo-random test vectors.

TABLE 3

Fault coverage (%) for ISCAS benchmarks
Number of Scan Chains (k)

| Circuit | n | 10 | 11 | 12 | 13 | 14 | 15 | Random Patterns |
|---|---|---|---|---|---|---|---|---|
| c2670 | 10 | 91.93 | 88.50 | 88.01 | 87.69 | 87.93 | 87.69 | 89.00 |
|  | 11 | 87.73 | 87.69 | 88.05 | 88.18 | 87.53 | 87.69 |  |
|  | 12 | 87.57 | 87.93 | 87.53 | 87.69 | 87.89 | 88.22 |  |
| c3540 | 11 | 100 | 100 | 99.94 | 100 | 99.97 | 99.94 | 100 |
| c5315 | 11 | 100 | 100 | 100 | 100 | 100 | 100 | 100 |
| c6288 | 11 | 100 | 100 | 100 | 100 | 100 | 100 | 100 |

TABLE 3-continued

Fault coverage (%) for ISCAS benchmarks

| Circuit | n | Number of Scan Chains (k) | | | | | | Random Patterns |
|---|---|---|---|---|---|---|---|---|
| | | 10 | 11 | 12 | 13 | 14 | 15 | |
| c7552 | 10 | 96.67 | 97.14 | 97.05 | 96.55 | 96.76 | 97.03 | 96.73 |
| | 11 | 96.80 | 96.89 | 96.90 | 96.98 | 96.29 | 96.51 | |
| | 12 | 96.93 | 96.64 | 96.93 | 96.80 | 96.95 | 97.14 | |
| s3330 | 11 | 87.84 | 88.95 | 88.36 | 88.29 | 88.22 | 88.36 | 87.95 |
| | 12 | 87.74 | 88.08 | 88.33 | 87.25 | 88.22 | 87.28 | |
| | 13 | 88.71 | 87.70 | 87.63 | 88.75 | 87.80 | 87.49 | |
| s3384 | 11 | 96.26 | 95.91 | 96.23 | 96.08 | 96.17 | 96.14 | 96.01 |
| | 12 | 96.14 | 96.29 | 96.17 | 96.03 | 96.05 | 96.05 | |
| | 13 | 96.11 | 96.17 | 96.05 | 96.14 | 96.14 | 96.08 | |
| s4863 | 11 | 98.36 | 98.36 | 98.14 | 99.05 | 97.52 | 97.43 | 97.66 |
| | 12 | 97.37 | 97.69 | 97.71 | 98.43 | 97.33 | 98.04 | |
| | 13 | 98.58 | 97.45 | 97.11 | 98.45 | 97.47 | 97.91 | |
| s5378 | 11 | 99.67 | 99.80 | 99.71 | 99.60 | 99.60 | 99.65 | 99.78 |
| | 12 | 99.73 | 99.78 | 99.80 | 99.76 | 99.69 | 99.84 | |
| | 13 | 99.56 | 99.89 | 99.78 | 99.78 | 99.80 | 99.71 | |
| s9234 | 11 | 93.68 | 93.22 | 93.61 | 92.23 | 93.78 | 93.61 | 93.13 |
| | 12 | 92.48 | 92.69 | 94.08 | 93.45 | 93.20 | 92.90 | |
| | 13 | 92.79 | 92.66 | 92.62 | 93.00 | 93.48 | 92.59 | |
| s13207 | 11 | 98.21 | 98.37 | 98.71 | 98.48 | 97.87 | 97.32 | 98.60 |
| | 12 | 99.19 | 98.69 | 98.68 | 98.65 | 98.48 | 98.30 | |
| | 13 | 98.25 | 98.67 | 98.53 | 98.32 | 98.83 | 98.95 | |
| s15850 | 11 | 95.50 | 95.42 | 95.84 | 95.07 | 96.14 | 95.99 | 95.72 |
| | 12 | 95.48 | 96.77 | 95.64 | 95.69 | 95.76 | 95.65 | |
| | 13 | 96.31 | 95.21 | 95.97 | 95.90 | 95.47 | 95.61 | |
| s38417 | 13 | 94.80 | 95.43 | 95.00 | 95.07 | 94.85 | 95.08 | 95.40 |
| | 14 | 94.99 | 95.14 | 95.37 | 95.34 | 95.20 | 95.68 | |
| | 15 | 95.45 | 94.83 | 95.19 | 95.64 | 95.42 | 95.24 | |
| s38584 | 13 | 99.46 | 99.39 | 99.46 | 99.48 | 99.55 | 99.39 | 99.46 |
| | 14 | 99.54 | 99.44 | 99.51 | 99.42 | 99.37 | 99.45 | |
| | 15 | 99.34 | 99.51 | 99.50 | 99.58 | 99.40 | 99.40 | |

Figure 5:
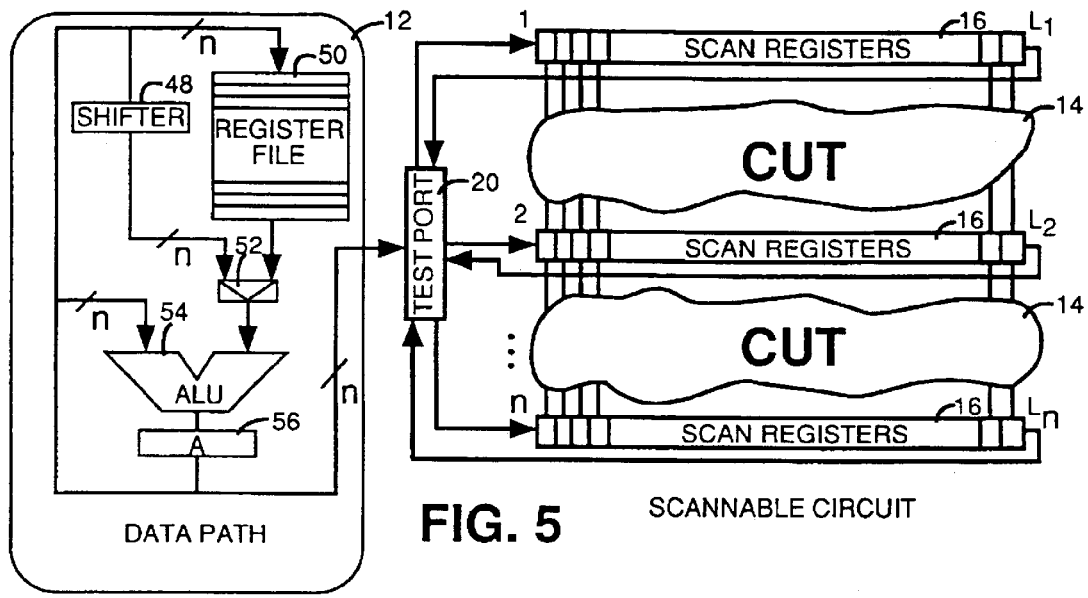
FIGS. 5–7 illustrate one embodiment of the arithmetic parallel decompressor of the present invention.
Figure 6:
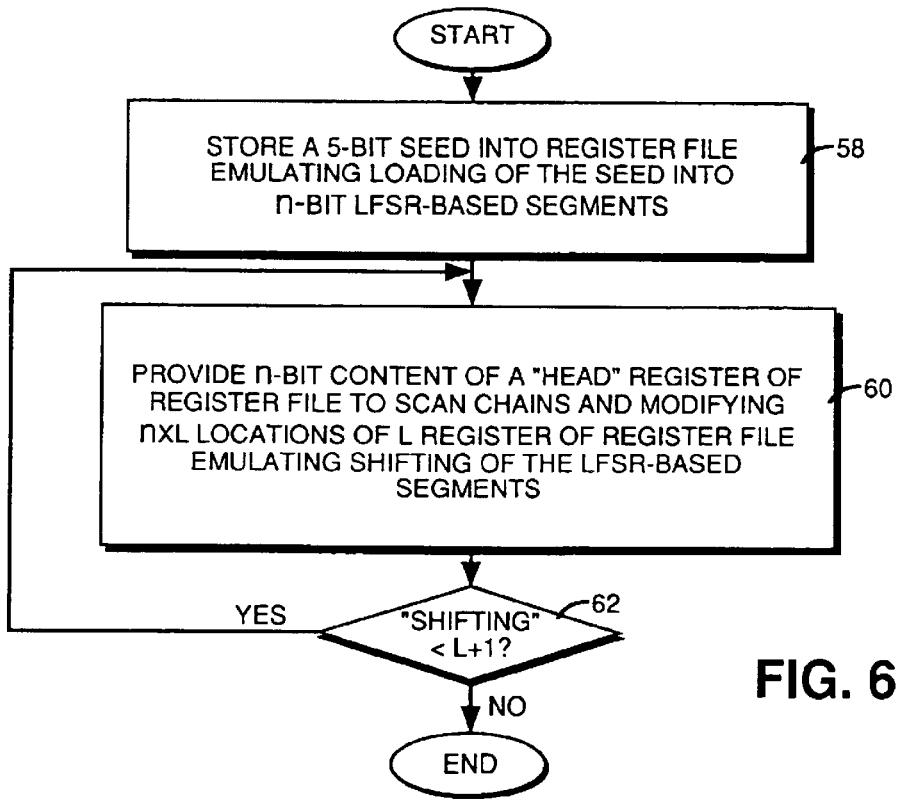
Figure 7:
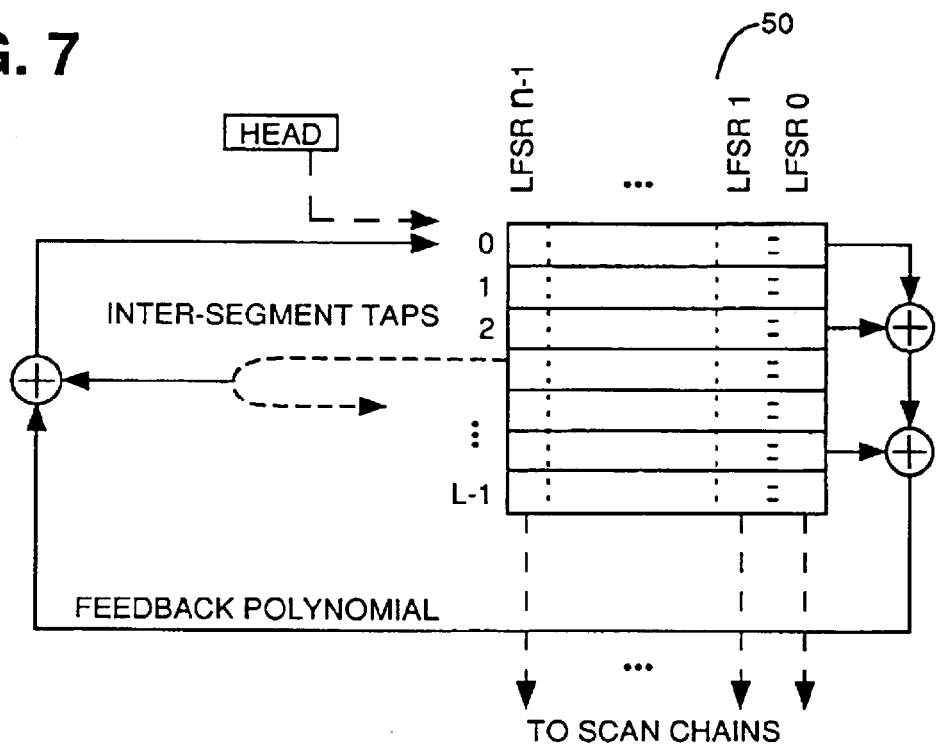

Referring now to FIGS. 5–7, wherein one embodiment of the arithmetic parallel decompressor of the present invention is illustrated. The arithmetic parallel decompressor generates 2-D deterministic test patterns based on compressed test seeds. More specifically, the arithmetic parallel decompressor generates multiple test cubes of each 2-D deterministic test pattern in parallel based on a corresponding pre-computed compressed test seed. The arithmetic parallel decompressor generates the multiple test cubes in parallel by successively modifying a data structure, emulating successive shifting of a number of LFSR-based segments interconnected by a network of linear functions.

Figure 12:
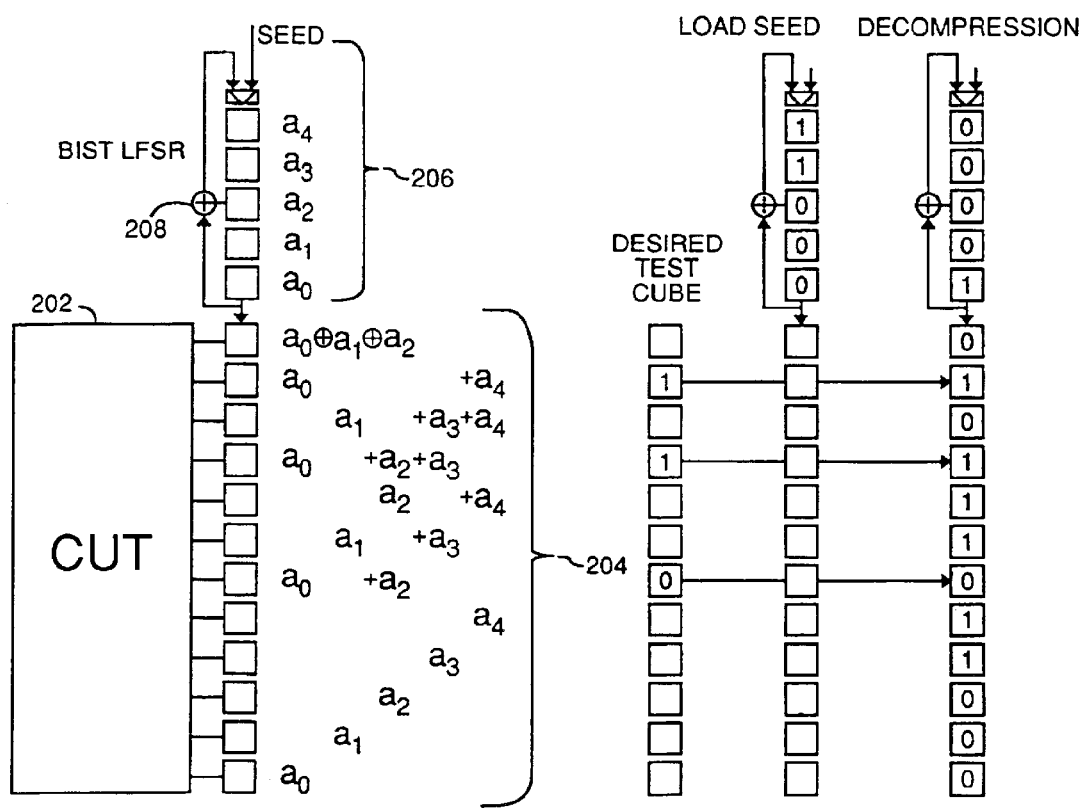
FIGS. 12–14 illustrate generation deterministic test vectors.
Figure 13:
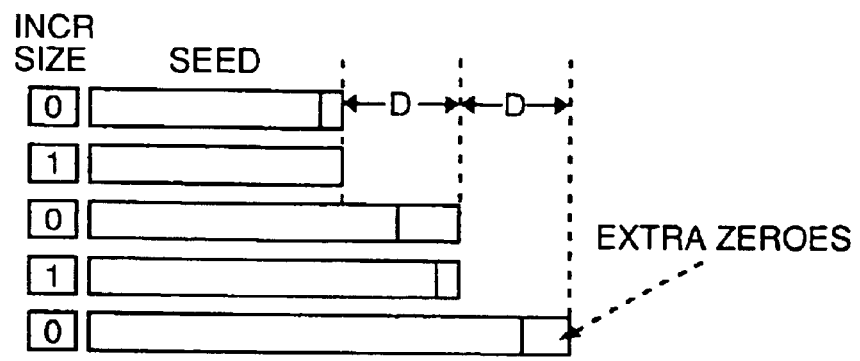
Figure 14:
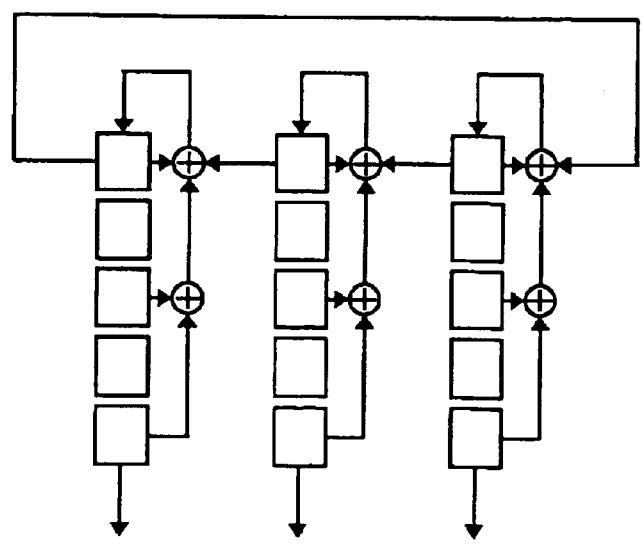

Before we describe FIGS. 5–7, we will first skip to FIGS. 12–14 wherein some basic concepts related to the generation of deterministic test patterns from pre-computed compressed test seeds are illustrated. FIG. 12 illustrates the basic concept of generating a test cube for a single scan chain based on a compressed test seed. Exemplary circuit under test 202 is shown having a single 12-bit associated scan chain 204, which is serially fed by a 5-bit LFSR 206. LFSR 206 includes XOR gate 208 for implementing a simple feedback polynomial, i.e., the feedback bit is equal to the XOR (circled +) of the shift out bit, and the middle bit (bit three). Thus, if a seed with the values (a0, a1, a2, a3, a4) is loaded into LFSR 206 as shown, after 12 successive cycles of right shifting, the values in scan chain 204 will be a0, a1, a2, a3, a4, a0+a2, a1+a3 and so forth. In other words, if a deterministic test vector of "x1x1xx0xxxxx" is desired (x stands for "don't care", either 0 or 1), the deterministic test vector may be generated from the test seed (a0, a1, a2, a3, a4) where a0+a4=1, a0+a2+a3=1, and a0+a2=0. Thus, based on these three equations, one of the test seeds that can be used to generate the desired deterministic vector is (0, 0, 0, 1, 1). In practice, the LFSR is reset before a test seed is loaded and the deterministic test vector is generated. Therefore, for the above example, it is possible to generate the desired deterministic test cube from the pre-computed compressed seed of (1, 1), and decompression commences upon resetting LFSR 206, and shifting 2-bits of the compressed seed (1,1) into LFSR 206.

In general, a deterministic test cube of length L can be generated by loading a pre-computed s-bit seed into a k-bit LFSR (s<k+1), and successively right shifting the LFSR and the scan chain L times. It has been shown that a desired deterministic test cube with s specified bits can be encoded, on the average, with an s-bit compressed seed. The probability that a solution will exist for the system of equations employed to compute the s-bit compressed seed is greater than 0.999999 provided a LFSR greater than s+20 is used, as was shown by S. Hellebrand, J. Rajski, S. Tarnick, S. Venkataraman and B. Courtois in the paper entitled "Built-In Test for Circuits with Scan Based on Reseeding of Multiple-Polynomial Linear Feedback Shift Registers", *IEEE Trans. on Computers*, vol. C44, February 1995, pp. 223–33. The system of equations can be solved very efficiently using Gauss-Jordan elimination as fast row operations can be achieved with bit-wise operations.

Since the number of specified bits varies from test cube to test cube, consequently, the length of the corresponding seeds also varies. Thus, in practice, in order to allow variable length seeds, the seed length must be specified. One approach is to employ a "test controller" to maintain the current length of the seed, and one extra bit is padded to each seed to indicate when the current length should be increased, as illustrated in FIG. 13. Under the illustrated approach, each increase is by an amount of a constant increment d. Since constant increment is employed, the approach also requires extra zeroes to be added to the seeds such that their length can always be expressed as b+id, i=0, 1, 2, . . . , where b is the length of the shortest seed. The value of increment d can be chosen such that the number of extra zeroes is kept at a minimum.

This approach of generating a deterministic test cube with s specified bits from a pre-computed compressed seed of s-bits can be extended to multiple parallel scan chains. A deterministic test pattern with test cubes having some specified bits can be generated for a number of parallel scan chains by way of a corresponding number of LFSR-based segment interconnected together with a network of linear functions, as illustrated in FIG. 14. For the illustrated embodiment, all LFSR-based segments implement the same feedback polynomial. Note that the feedback polynomial is more complex than the simple feedback polynomial illustrated in FIG. 12. In particular, the feedback polynomial includes inter-segment feedback from corresponding segment positions, which can be implemented by one rotate (ROT) and one exclusive-or (XOR) instruction. Any n×L desired deterministic test pattern to be populated into n scan chains, each of length L, with s specified bits, may be represented by a set of system equations to pre-compute the corresponding s-bit compressed seed, in the same manner the seed is computed for the basic case illustrated in FIG. 12. During operation, the n×L desired deterministic test pattern with s specified bits may then be generated by loading the s-bit seed into the LFSR-based segments, and then "right shifting" the LFSR-based segments L times to generate the pattern. The deterministic test pattern may be provided to the scan chains incrementally, as each of the shifting operations is performed.

Returning now to FIG. 5, for the illustrated embodiment, the arithmetic parallel decompressor is practiced using shifter 48, register file 50, multiplexor 52, arithmetic logic unit (ALU) 54 and accumulator 56. One embodiment of the method steps of operation is illustrated in FIG. 6. But before describing FIG. 6, we skip first to FIG. 7, wherein a logical view of register file 50 is illustrated. For the illustrated embodiment, L registers, each with n storage locations, are employed to form a circular buffer to emulate n LFSR-based segments of length L each. Additionally, for the illustrated embodiment, a register (labeled "HEAD") is also used to store a pointer to identify the "head" of the circular buffer, at any one point in time, for emulating shifting. The n×L storage locations are successively modified as if the contents of the n LFSR segments are successively shifted. The successive modifications made also emulate the effect of the predetermined feedback polynomial. At the beginning of each iteration, the n-bit content of the "head" register is provided in parallel for scan chains 16, by way of test port register 20, emulating shift-outs from the LFSR-based segments to the scan chains. In other words, at each iteration, 1-bit is provided to each scan chain 16. Thus, after L iterations (L being the length of a scan chain 16), scan chains 16 will be filled with a 2-D deterministic test pattern.

Returning now to FIG. 6, in step 58, a s-bit seed is stored into register file 50 emulating loading of the seed into a n L-bit LFSR-based segments. In step 60, the n-bit content of a "head" register of register file 50 is provided in parallel to scan chains 16, and n×L storage locations of L registers with n storage locations each of register file 50 are modified (in accordance with a predetermined feedback polynomial), emulating shifting of the n L-bit LFSR-based segments. Step 60 is repeated L times, emulating successive application of L clock cycles to fill scan chains 16.

Experiments were performed on the largest ISCAS'89 circuits described by F. Brglez, D. Bryan, and K. Kozminski in the paper entitled "Combinational Profiles of Sequential Benchmark Circuits". Proc. Int Symp. on Circuits and Systems, 1989, pp. 1929–1934, assuming a data path of width 8, 16, or 32. Furthermore, the number of scan chains was assumed to be equal to the width of the data path. For a width n, a single length L is chosen for each of n LFSR-based segments for a given circuit, where L is greater than n as well as greater than s+20, where s is the maximum number of specified bits in a test vector. Recall that this requirement insures that a seed can be obtained with probability greater than 0.999999. The LFSR-based segments were linked together by an XOR interconnection network such that the network connects the ith segment to segment number i+2.sup.v (mod n), for v=0, 1, . . . , log.sub.2 n−1. Note that the polynomial used to implement the decompressor should contain a sufficient number of feedback taps in order the reduce the probability of linear dependency, as was suggested by J. Rajski and J. Tyszer in the paper entitled "On Linear Dependencies in Subspaces of LFSR-Generated Sequences,", IEEE Transactions on Computers, Vol. 45, No. 10, October 1996. Consequently, the probability of not finding a seed for a given test pattern will be minimized as well. In order to minimize the number of instructions executed per cycle, inter-segment connections were simplified whenever possible.

For each circuit, 10K random patterns were first produced by the arithmetic pseudo-random test vector generator and applied to the circuits in order to detect the easy-to-test faults. After that, an automatic generator of deterministic test patterns was used to produce test patterns to achieve complete stuck-at-fault coverage. Table-4 shows the characteristics of the resulting test patterns. It lists the number deterministic patterns required to achieve complete fault coverage (NP), the size of each pattern in bits (Size), the maximum number of specified bits in a test cube ($S_{max}$), and the volume of test data if the test cubes are stored in memory (Volume).

TABLE 4

Characteristics of deterministic patterns

| Circuit | NP | Size | Smax | Volume (bits) |
|---|---|---|---|---|
| s9234 | 104 | 247 | 112 | 25 688 |
| s13207 | 176 | 700 | 183 | 123 200 |
| s15850 | 56 | 611 | 249 | 34 216 |
| s38417 | 78 | 1664 | 472 | 129 792 |
| s38584 | 52 | 1464 | 229 | 76 128 |

In this illustrative embodiment, concatenation of test patterns is employed. Therefore, the concatenated test patterns were divided into test groups. The test groups were formed such that the total number of specified bits in all the groups is approximately the same. Groups of eight concatenated test cubes were utilized to meet this criterion.

Table 5 shows the characteristics of the decompressor. The table enumerates for each circuit, the width of the data path, the polynomial of all the LFSR-based segments, the tap positions where the connections between the LFSR-based segments and the scan chains were taken, and the list of rotates (i.e., inter-segment feedback). The degree of the polynomial is equal to the number of memory words needed to implement the decompressor. For a data path of width 32, all the decompressors can be realized with no more than 52 memory words. The number of terms in the polynomial and the number of rotates gives a good approximation of the number of XOR and ROT instructions (per cycle) required to emulate the decompressor. In all cases, less than 10 XOR and ROT instructions are required per cycle to implement the arithmetic parallel decompressor of the present invention. If instructions are added to handle the circular buffer, performing signature compaction and transferring data to the scan registers, one cycle can be implemented in less than 30 machine instructions.

Table 6 shows the final results. For each circuit, the table lists the number of test groups, the size of each seed, the storage needed to store the seeds (TD), and the compression ratio (CR). The test data volume is calculated by multiplying the number of test groups by the size of each seed. The table reports the data once for each circuit since the results are independent of the width of the data path. Based on Table 6, it can be seen that the amount of test data is small, and comparable to the total number of specified bits in the deterministic test cubes, which yields high compression ratios.

TABLE 5

Charateristics of decompressors

| Circuit | Width | Polynomial (Powers of x) | Tap Position | List of Rotates |
|---|---|---|---|---|
| s9234 | 8 | 44, 5, 0 | 43 | 1, 2, 4 |
|  | 16 | 22, 5, 0 | 21 | 1, 2 |
|  | 32 | 11, 5, 0 | 10 | 1, 2 |
| s13207 | 8 | 36, 7, 3, 0 | 35, 30 | 1, 2, 4 |
|  | 16 | 18, 7, 0 | 17 | 1, 2, 4 |
|  | 32 | 9, 1, 0 | 8 | 1, 2, 4, 8 |
| s15850 | 8 | 132, 26, 0 | 132, 32 | 1, 2, 4 |
|  | 16 | 66, 13, 0 | 65, 32 | 1, 2, 4 |
|  | 32 | 33, 13, 0 | 32 | 1, 2 |
| s38417 | 8 | 208, 48, 31, 18, 11, 0 | 207 | 1 |
|  | 16 | 104, 48, 31, 18, 11, 0 | 103 | 1 |
|  | 32 | 52, 48, 31, 18, 11, 0 | 51 | 1 |
| s38584 | 8 | 64, 9, 5, 0 | 53 | 1, 2 |
|  | 16 | 32, 9, 5, 0 | 31 | 1, 2 |
|  | 32 | 16, 9, 5, 0 | 15 | 1, 2 |

TABLE 6

Compression results

| Circuit | Test Groups | Size Seed | TD (bits) | CR |
|---|---|---|---|---|
| s9234 | 13 | 352 | 4 576 | 5.6 |
| s13207 | 22 | 288 | 5 236 | 23.5 |
| s15850 | 7 | 1056 | 7 392 | 4.6 |
| s38417 | 10 | 1664 | 16 640 | 7.8 |
| s38584 | 7 | 512 | 3 584 | 21.2 |

Figure 8:
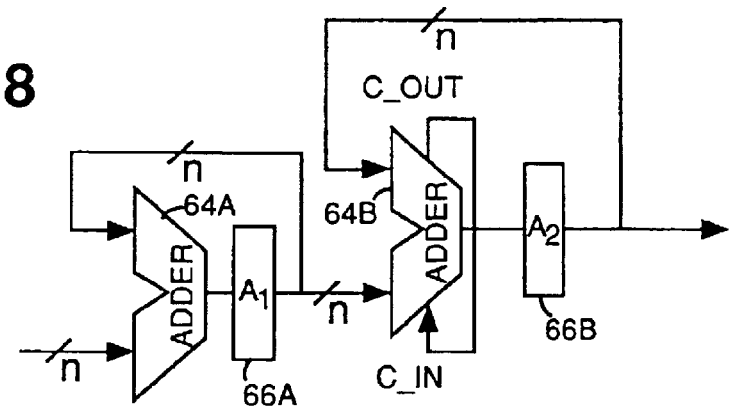
FIGS. 8–10 illustrate one embodiment of the arithmetic test response compactor of the present invention.
Figure 9:
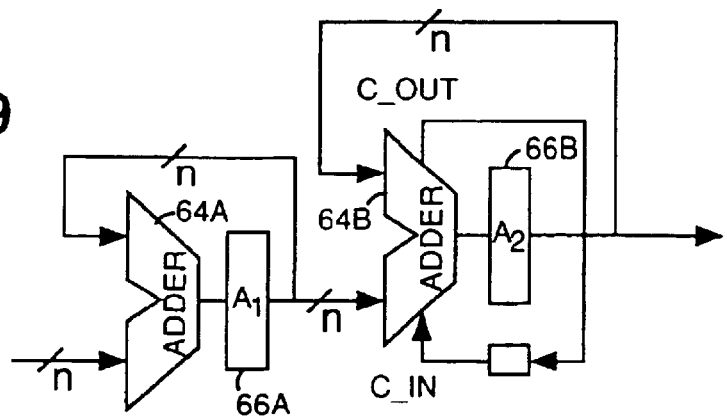
Figure 10:
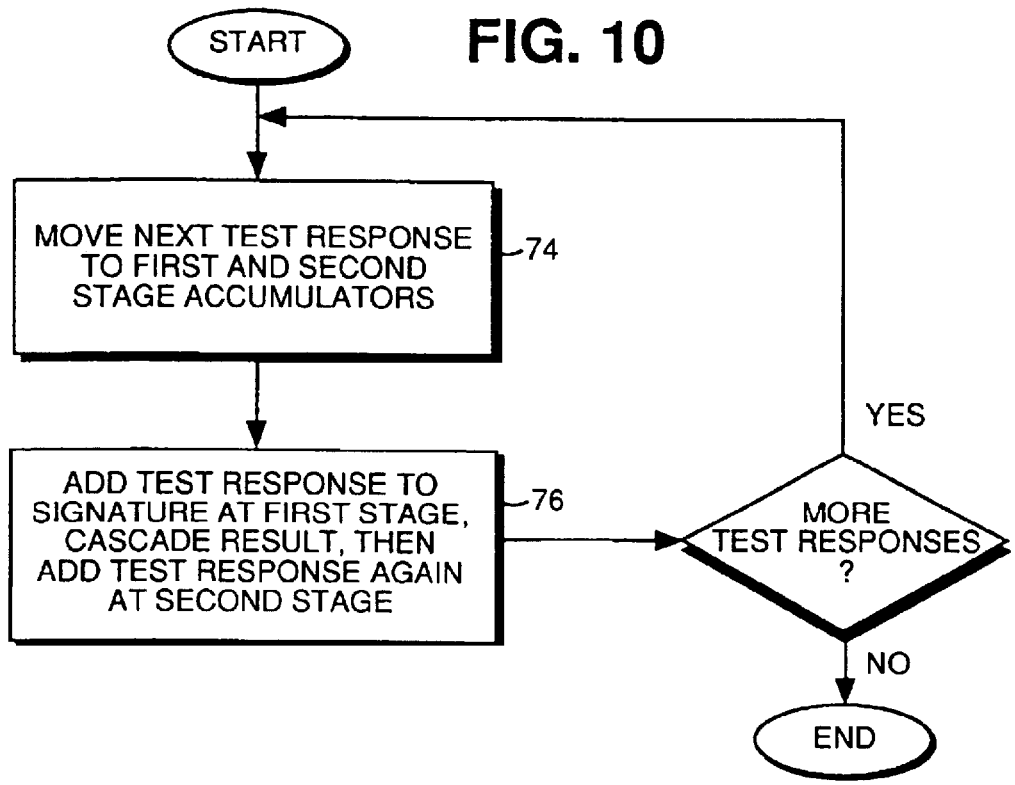

Referring now to FIGS. 8–10, wherein two embodiments of the arithmetic test response compactor of the present invention are shown. For the illustrated embodiment, the arithmetic test response compactor of the present invention is practiced using adders 64a and 64b, and accumulators 66a and 66b of embedded processor core 12 in a two stage manner. In step 74, an n-bit segment of the responses of peripheral devices 14 (1-bit from each scan chain 16) is moved to accumulators 66a and 66b at both the first and the second stage by way of test port register 20, and in step 76, the n-bit test response segment is first added to the signature value at the first stage, and the result is cascaded to the second stage. At the second stage, the n-bit test response segment is added to the cascaded result again. Steps 74 and 76 are repeated until all test response segments have been compacted into the signature. The process is repeated for the test responses of peripheral devices 14 to each test pattern.

Note that all additions performed at the first stage are straight forward addition operations, whereas the additions performed at the second stage are modulo $2^n-1$ addition. This is accomplished by setting up a feedback connection between the carry-out line and the carry-in line of the second stage adder 64b, as illustrated in FIGS. 8–9. Furthermore, in one embodiment, the second stage addition is performed in a 1's complement convention (FIG. 8), whereas in an alternate embodiment, the second stage addition is performed using a rotate carry scheme (FIG. 9). For further description of 1's complement compaction, see J. Rajski and J. Tyszer, "Accumulator-Based Compaction of Test Responses", *IEEE Trans. on Computers*, June 1993, pp. 643–50, and for further description of rotate carry addition, see J. Rajski and J. Tyszer, "Test responses compaction in accumulator with rotate carry adders", *IEEE Trans. CAD of IC*, April 1993, pp. 531–539.

The cascaded add-and-accumulate manner of compacting test responses is employed to reduce the impact of the error compensation phenomenon. As previously demonstrated by J. Rajski and J. Tyszer in the paper entitled "Accumulator-Based Compaction of Test Responses", *IEEE Trans. on Computers*, June 1993, pp. 643–50, the aliasing probability is $(2^n-1)^{-1}$. In the transition period, however, the aliasing in adders may occur more frequently than indicated by the asymptotic value of the aliasing probability function. This phenomenon can be partially attributed to an error compensation effect. It occurs when a fault injected with an error pattern (i.e., a difference between erroneous and error-free response segments applied to the adder's inputs) d is then subsequently injected with the opposite error pattern −d, so that they cancel each other during an addition. Note that if a fault is always injected that way, i.e., the error pattern d is followed by the error pattern −d, and vice versa, the resultant asymptotic aliasing probability will be 0.5, regardless of the compaction scheme used, i.e., the type of addition and the size of the adder.

However, under the cascaded approach of the present invention, after a first fault injection with the error pattern d, both accumulators contain data which differs from the fault-free signature by d. The next injection with the opposite pattern −d will lead to aliasing in the first accumulator. However, since the second addition involves the erroneous content of the second accumulator and newly obtained error-free input from the first stage, the presence of the fault will nevertheless be maintained in the second accumulator. Stated formally, if successive error patterns which occur due to fault injections are d, −d, d, −d, . . . , etc., then the corresponding injections into the second stage are represented by d, 0, d, 0, . . . , etc. In fact, the error pattern d is handled by the second stage adder as a number taken modulo $2^n-1$. Since $d=d-2^n \bmod 2^n$, i.e., it also represents negative differences, the actual error pattern injected into the second stage becomes equal to one of two different values: d mod $2^n-1$ or $d-2^n \bmod 2^n-1$, depending on the current values of error-free and erroneous test response segments. Clearly, in either case the resultant sequence does not invoke the error compensation, and the resultant aliasing probability will be $(2^n-1)^{-1}$.

Furthermore, as was described by J. Rajski and J. Tyszer in the paper entitled "Accumulator-Based Compaction of Test Responses", *IEEE Trans. on Computers*, June 1993, pp. 643–50, the aliasing probability of $(2^n-1)^{-1}$ in the 1's complement adders is assured for a given fault provided that its corresponding error pattern $d_1, d_2, \ldots, d_k$, and the number $2^n-1$ of states of the compactor are relatively prime. However, under the cascaded approach of the present invention, the restriction is eliminated as the scheme still guarantees the aliasing probability in the second stage at the level of $(2^n-1)^{-1}$, regardless of the nature of the error patterns. Even if a fault is represented only by d and/or −d, and d is not prime to $2^n-1$, then as the error pattern d is actually injected into the second stage as two different patterns, the number d mod $2^n-1$ (the first error pattern) is odd or 0. Thus, the second error pattern d−$2^n$ mod $2^n-1$ is even. These two error patterns are clearly relatively prime with $2^n-1$.

Another superiority of the cascaded add-and-accumulate approach of the present invention can be seen when the approach's transient behavior is analyzed. Now we assume that a fault is represented by the error patterns d and −d which can be injected into the compactor with probabilities $p_1$ and $p_2$, respectively. Simulation experiments with different values of $p_1$ and $p_2$ and compactor's width clearly indicate that the steady state is reached much faster in the 2-stage compaction for both unidirectional faults ($p_1>0$, $p_2=0$) and bidirectional faults ($p_1>0$, $p_2>0$). In the vast majority of cases, there are virtually no oscillations and the difference between the maximum value of aliasing probability and its asymptotic value is negligible.

Figure 11:
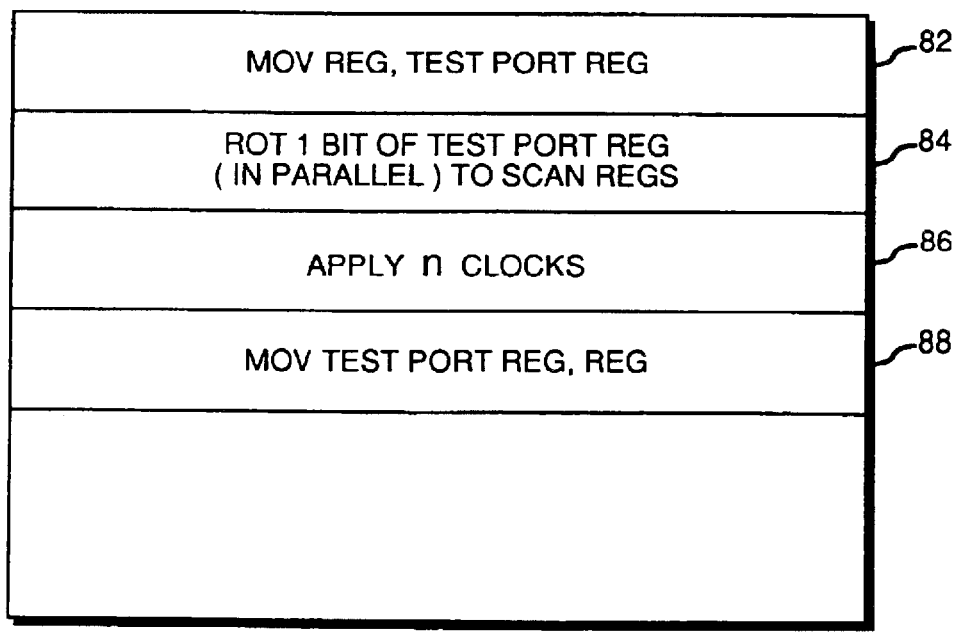
FIG. 11 illustrate one embodiment of the ABIST instructions provided to the exemplary IC.

FIG. 11 illustrates a number of ABIST instructions provided to exemplary IC 10 to facilitate usage of the arithmetic pseudo-random test vector generator, the arithmetic parallel decompressor, and the arithmetic test response compactor to provide ABIST for IC 10. As shown, in addition to the conventional register to register MOV instructions, ADD and Multiply instructions, embedded processor core 12 of exemplary IC 10 also includes support for MOV instruction 82 for moving the content of a register/accumulator to test port register 20, and ROT instruction 84 for rotating in parallel the content of test port register 20 to the first cells of scan registers 16 (1 bit per scan register 16), and in parallel the last cells of scan registers 16 to test port register 20 correspondingly. In other words, for the illustrated embodiment, ROT instruction 84 treats test port register 20 and scan registers 16 as n shift registers, with each shift register being made up of a bit position of test port register 20 and a corresponding scan register 16, and rotates these n shift registers in parallel. Exemplary IC 10 further supports MOV instruction 88 for moving the recovered content into a register of register file 50 of embedded processor core 12. Lastly, exemplary IC 10 further support APPLY instruction 86 for applying a number of clock cycles to the circuits under test, i.e., peripheral devices 14, thereby applying the test pattern in scan registers 16 to peripheral devices 14. Implementation of the support for these instructions are well within those skilled in the art, thus the constitutions of these supports will not be further described.

Thus, as previously described with reference to FIG. 2, a 2-D pseudo-random/deterministic test pattern may be generated using embedded processor core 12, and provided to scan chains 16 by way of test port register 20. Upon loading scan chains 16 with the 2-D test pattern, it may be applied to the peripheral devices 14. The test responses of peripheral devices captured in scan chains 16 and returned to embedded processor core 12 by way of test port register 20 may be compacted.

Various embodiments have been employed to describe the present invention. Those skilled in the art will recognize that the invention is not limited to these embodiments described. The present invention can be practiced with modification and alteration within the spirit and scope of the appended claims. The various embodiments and their description are thus to be regarded as illustrative instead of restrictive on the present invention.

Thus, various methods and apparatuses related to arithmetic built-in self-test of multiple scan-based integrated circuits have been described.

What is claimed is:

1. A method, comprising:
    storing microcode in non-volatile memory in an integrated circuit for causing an embedded processor in the integrated circuit to generate a plurality of pseudo-random test patterns to be used in testing of the integrated circuit;
    storing microcode in the non-volatile memory for causing the embedded processor to move at least one of the plurality of pseudo-random test patterns to a test port register coupled to the embedded processor; and
    storing microcode in the non-volatile memory for causing the embedded processor to move test responses from the test port register to the embedded processor.

2. The method of claim 1, wherein the testing of the integrated circuit comprises testing a plurality of peripheral devices, the plurality of peripheral devices having associated parallel scan registers coupled to the embedded processor.

3. The method of claim 2, further comprising storing microcode in the non-volatile memory for causing the embedded processor to generate a plurality of deterministic test patterns for the plurality of peripheral devices.

4. The method of claim 1, further comprising storing microcode in the non-volatile memory for causing the embedded processor to compact the test responses.

5. The method of claim 4, wherein storing microcode for causing the embedded processor to compact the test responses comprises storing microcode in the non-volatile memory to cause the embedded processor to:
    move a first test response into a first accumulator;
    add a first signature to the first accumulator;
    move a second test response into a second accumulator;
    output the content of the first accumulator; and
    add the output of the first accumulator into the second accumulator.

6. The method of claim 5, wherein storing microcode for causing the embedded processor to compact the test responses further comprises storing microcode in the non-volatile memory to cause the embedded processor to:
    move the second test response into the first accumulator;
    add a second signature into the first accumulator, the second signature comprising the first test response;
    move a third test response into the second accumulator; and
    add the output of the first accumulator into the second accumulator.

7. The method of claim 1, further comprising providing an embedded processor having a plurality of data paths.

8. The method of claim 7, wherein the testing comprises using the plurality of data paths in a test mode of operation.

9. The method of claim 1, further comprising providing a test port register having a plurality of input ports and a plurality of output ports.

10. One or more computer-readable media having computer-executable instructions for performing a method comprising:
    storing microcode in non-volatile memory in an integrated circuit for causing an embedded processor in the integrated circuit to generate a plurality of pseudo-random test patterns to be used in testing of the integrated circuit;
    storing microcode in the non-volatile memory for causing the embedded processor to move at least one of the plurality of pseudo-random test patterns to a test port register coupled to the embedded processor; and storing microcode in the non-volatile memory for causing the embedded processor to move test responses from the test port register to the embedded processor.

11. An apparatus, comprising:
means for generating pseudo-random test patterns in an integrated circuit, wherein the integrated circuit comprises an embedded processor core and a plurality of peripheral devices, the embedded processor core comprising a plurality of data paths, and wherein the means for generating pseudo-random test patterns comprises multiplying n least significant bits of a 2n-bit pseudo-random number generated in an immediately preceding iteration and stored in a first register, with an n-bit multiplier constant stored in a second register to produce a 2n-bit product;
means for testing the plurality of peripheral devices using the pseudo-random test patterns and the plurality of data paths; and
means for compacting peripheral device test-response data.

12. The apparatus of claim 11, wherein the embedded processor core comprises a plurality of registers, at least one multiplier, at least one adder, and at least one accumulator.

13. The apparatus of claim 11, wherein the integrated circuit further comprises a test port register, the test port register serving as an interface between the embedded processor core and at least one scan register.

14. The apparatus of claim 11, wherein the means for generating pseudo-random test patterns further comprises adding the 2n-bit product to n most significant bits of the 2n-bit pseudo-random number stored in n least significant locations of an accumulator with 2n locations to produce a new 2n-bit pseudo-random number for a current iteration.

15. The apparatus of claim 14, wherein the means for generating pseudo-random test patterns further comprises outputting n least significant bits of the new 2n-bit pseudo-random number as an n-bit pseudo-random test vector for the plurality of peripheral devices.

16. The apparatus of claim 11, wherein the means for compacting peripheral device test-response data comprises:
means for moving an n-bit segment of the peripheral device performance data to a first-stage accumulator;
means for adding the n-bit segment to a signature value at the first-stage accumulator;
means for cascading the signature value to a second-stage accumulator; and
means for adding the n-bit segment to the cascaded result.

17. The apparatus of claim 16, wherein the means for cascading the signature value to the second-stage accumulator comprises a 1's complement convention.

18. The apparatus of claim 16, wherein the means for cascading the signature value to the second-stage accumulator comprises a rotate carry scheme.

19. A method for testing integrated circuits, comprising:
a step for producing at least one two-dimensional pseudo-random test pattern in an integrated circuit, the integrated circuit having an embedded processor and a peripheral device;
a step for generating at least one two-dimensional deterministic test pattern in the integrated circuit;
a step for testing the peripheral device using the two-dimensional pseudo-random test pattern and the two-dimensional deterministic test pattern; and
a step for compacting test-response data.

20. The method of claim 19, wherein the step for testing the peripheral device comprises a step for providing the two-dimensional pseudo-random test pattern and the two-dimensional deterministic test pattern to the peripheral device via a test port register, the test port register coupled to the embedded processor and at least one scan register.

21. The method of claim 19, further comprising a step for repeating the step for testing the peripheral device until all desired test patterns have been produced and used in the testing.

* * * * *